United States Patent
Yang

(10) Patent No.: US 7,972,942 B1
(45) Date of Patent: Jul. 5, 2011

(54) METHOD OF REDUCING METAL IMPURITIES OF UPGRADED METALLURGICAL GRADE SILICON WAFER BY USING EPITAXIAL SILICON FILM

(75) Inventor: Tsun-Neng Yang, Taipei (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 12/887,665

(22) Filed: Sep. 22, 2010

(51) Int. Cl.
*H01L 21/322* (2006.01)

(52) U.S. Cl. .............. 438/476; 257/E23.137; 257/913

(58) Field of Classification Search .............. 438/476, 438/913; 257/E23.137
See application file for complete search history.

(56) References Cited

U.S. PATENT DOCUMENTS

| 5,422,299 | A  | * | 6/1995 | Neudeck et al. | 438/360 |
| 6,174,349 | B1 | * | 1/2001 | DeSantis | 95/205 |
| 6,284,384 | B1 | * | 9/2001 | Wilson et al. | 428/450 |
| 6,583,024 | B1 | * | 6/2003 | Kononchuk et al. | 438/404 |
| 2009/0056805 | A1 | * | 3/2009 | Barnett et al. | 136/256 |
| 2010/0279492 | A1 | * | 11/2010 | Yang | 438/476 |

* cited by examiner

*Primary Examiner* — Jarrett J Stark
(74) *Attorney, Agent, or Firm* — Lee & Hayes, PLLC

(57) ABSTRACT

Metal impurities of an upgraded metallurgical grade (UMG) silicon (Si) wafer are reduced. The UMG Si wafer having a 5N (99.999%) purity is chosen to grow a high-quality epitaxial Si thin film through atmospheric pressure chemical vapor deposition (APCVD). Through heat treating diffusion, the epitaxial Si film is used to form sink positions for the metal impurities in the UMG Si wafer. By using concentration gradient, temperature gradient and interface defect, individual and comprehensive effects are built for enhancing purity of the UMG Si wafer from 5N to 6N. Thus, a low-cost Si wafer can be fabricated for Si-based solar cell through a simple, fast and effective method.

8 Claims, 6 Drawing Sheets

METHOD OF REDUCING METAL IMPURITIES OF UPGRADED METALLURGICAL GRADE SILICON WAFER BY USING EPITAXIAL SILICON FILM

TECHNICAL FIELD OF THE DISCLOSURE

The present disclosure relates to reducing metal impurities of a silicon (Si) wafer; more particularly, relates to enhancing a 99.999% (5N) purity of an upgraded metallurgical grade (UMG) Si wafer to a 99.9999% (6N) purity for obtaining a physically-made solar-grade Si wafer to be used in fabricating a Si-based solar cell.

DESCRIPTION OF THE RELATED ARTS

Need for energy grows fast nowadays and storage of petrochemical material is thus reduced rapidly. Cost for energy becomes higher with crises of earth warming, climate change and environment pollution.

Solar energy is a green and ever-lasting energy. The solar energy shown on earth for a day may fulfill needs of all people. Therefore, low-cost solar energy for wide application is very important to people.

For using solar energy cheaply and widely, cost for fabricating a solar cell is a key issue. Gettering process for semiconductor material is a method for reducing metal impurities in a semiconductor material. Therein, most metal impurities harmful to characteristic performance of the semiconductor material can be limited in some certain areas while these limited areas for metal impurities are far away from photoelectric active region of the semiconductor material. Hence, the best way for gettering is to build sink positions for the metal impurities.

The gettering processes includes two major categories: one is inner gettering and the other is outer gettering. For solar cells, inner gettering is not an effective method. It is because that, when sun light shines on solar cell, photons enter into the semiconductor material and carriers thus generated (i.e. electron-hole pair) must pass through the semiconductor material across its whole thickness to reach electrode positions for collecting electrons and holes, respectively.

Inner gettering methods used for semiconductor material of solar cell includes: aluminum gettering, phosphorus diffusion gettering, pore structure gettering, ion implantation, chemical etching, etc. Or, a strain can be formed on surface of or inside the semiconductor material by mechanical abrasion, laser scribing or ion bombardment. Or, a heterostructure thin film, like amorphous silicon, $Si_3N_4$ or $Al_2O_3$, can be deposited to be used as gettering positions formed inside and at interface.

The above prior arts require a diffusion process with a high temperature furnace for a time period between several hours to tens of hours at a diffusion temperature not higher than 1000 Celsius degrees (° C.). However, although after being diffused for a long time, most of the harmful metal, like Fe, Cr, Mn, Ti, Zn, V or Mo, is not greatly diffused for its relatively low diffusion rate at such a diffusion temperature not higher than 1000° C. As a result, efficiency of the solar cell is not obviously enhanced after the impurity diffusion process. Hence, the prior arts do not fulfill all users' requests on actual use.

SUMMARY OF THE DISCLOSURE

The main purpose of the present disclosure is to reduce a metal impurity concentration of a UMG Si wafer to a level close to a metal impurity concentration for a solar-grade Si material for obtaining a low-cost physically-made solar-grade Si wafer to be used in fabricating a low-cost Si-based solar cell.

The second purpose of the present disclosure is to enhance a 5N purity of the UMG Si wafer to a 6N purity.

The third purpose of the present disclosure is to use an atmospheric pressure chemical vapor deposition (APCVD) equipment without a vacuum system to obtain a low-cost physically-made solar-grade silicon wafer by building diffusion mechanisms of concentration and temperature gradients and by using an epitaxial Si thin film having sink positions for metal impurities of a UMG Si wafer to be used for fabricating a solar cell device in a simple, fast and effective way.

To achieve the above purpose, the present disclosure is a method of reducing metal impurities of a UMG Si wafer by using an epitaxial Si film, comprising steps of: (a) obtaining a UMG Si substrate having a purity not bigger than 5N and a thickness not bigger than 200 micrometers (μm); (b) placing the UMG Si substrate on a graphite susceptor in a reaction chamber of an APCVD equipment and raising a temperature of the graphite susceptor by radiofrequency coils circled around the reaction chamber from a room temperature until at least 1100 Celsius degrees (° C.); (c) obtaining a gas of dicholosilane ($Si_2H_2Cl_2$) as a raw gas for Si epitaxy and a hydrogen has as a carrying gas of the $Si_2H_2Cl_2$ gas to obtain an epitaxial Si thin film on an upper surface of the UMG Si substrate with a lower surface of the UMG Si substrate facing to the graphite susceptor; and (d) stopping providing the raw gas of $Si_2H_2Cl_2$; keeping providing the carrying gas of $H_2$; and switching off power to rapidly reduce temperature after finishing diffusing metal impurities of the UMG Si substrate. Accordingly, a novel method of reducing metal impurities of a UMG Si wafer by using an epitaxial Si film is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the flow view showing the preferred embodiment according to the present disclosure.

DESCRIPTION OF THE PREFERRED EMBODIMENT

The following description of the preferred embodiment is provided to understand the features and the structures of the present disclosure.

Figure 1:
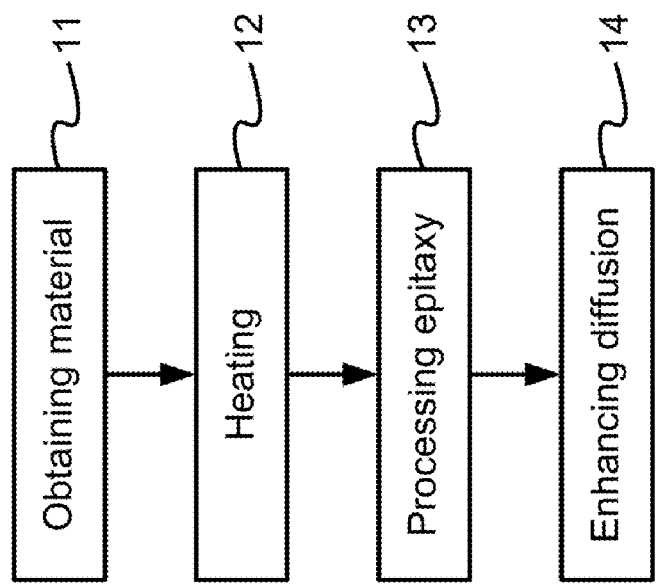
Figure 2:
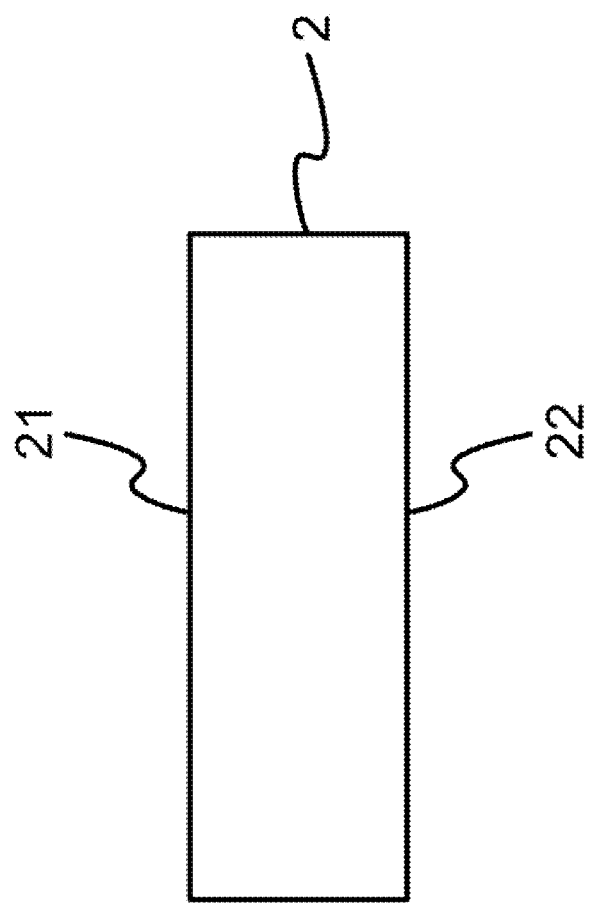
FIG. 2 is the view showing the material to be gettered.

Please refer to FIG. 1 to FIG. 5, which are a flow view showing the preferred embodiment according to the present disclosure; a view showing a material to be gettered; and views showing processes of heating, epitaxy and diffusion enhancement. As shown in the figures, the present disclosure is a method of reducing metal impurities of an upgraded metallurgical grade (UMG) silicon (Si) wafer by using an epitaxial silicon film, comprising the following four steps:

(a) Obtaining material 11: In FIG. 2, a UMG Si substrate 2 is selected to be gettered, where the UMG Si substrate 2 has a purity not bigger than 99.999% (5N) and a thickness not bigger than 200 micrometers (μm); and where the UMG Si substrate 2 is a p-type or n-type UMG Si substrate.

Figure 3:
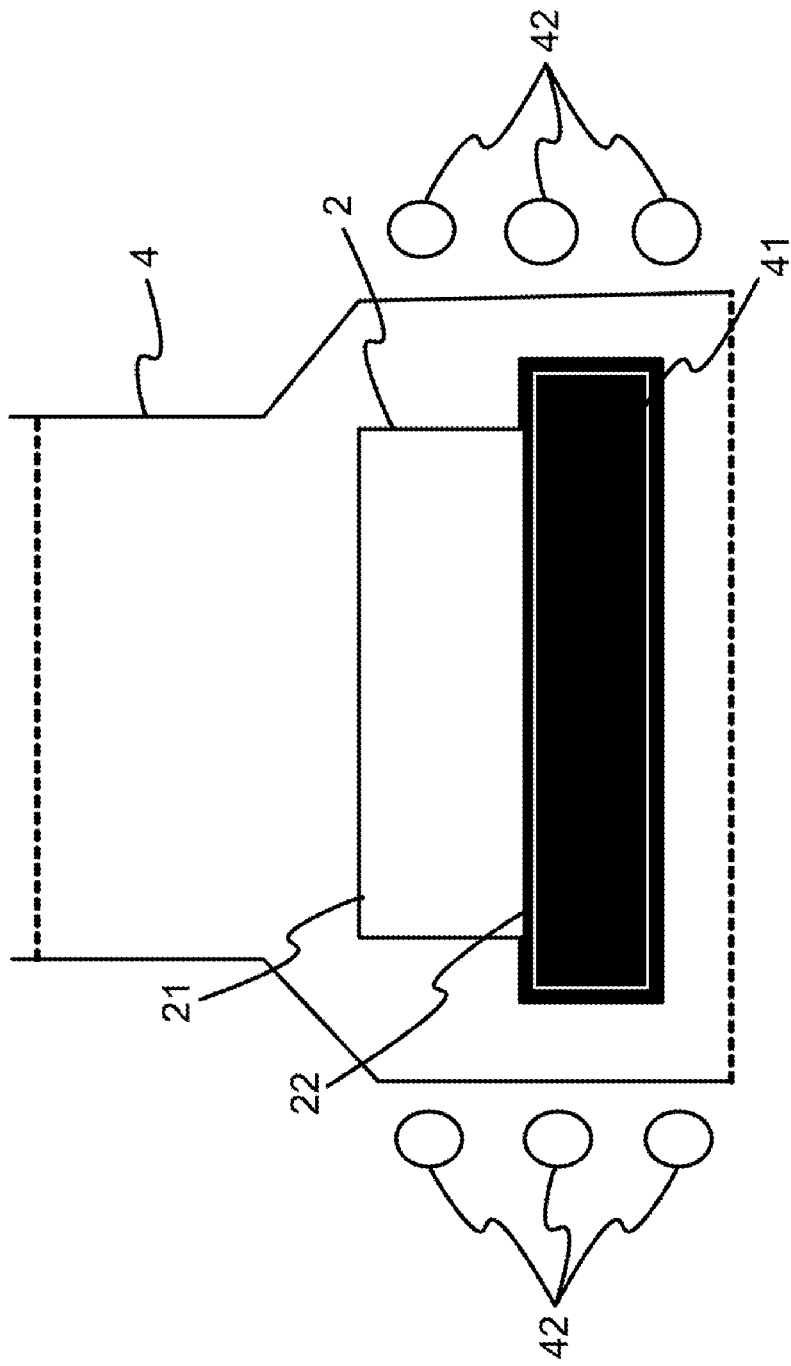
FIG. 3 is the view showing the process of heating.

(b) Heating 12: In FIG. 3, the UMG Si substrate 2 is put on a graphite susceptor 41 into an atmospheric pressure chemical vapor deposition (APCVD) reaction chamber 4; and, then, the graphite susceptor 41 in the APCVD reaction chamber 4 is heated by radiofrequency coils 42 circled around the reaction chamber of the APCVD reaction chamber 4 for a time period between 20 and 30 min to rapidly raise a temperature of the UMG Si substrate 2 from room temperature to at least 1100° C.

Figure 4:
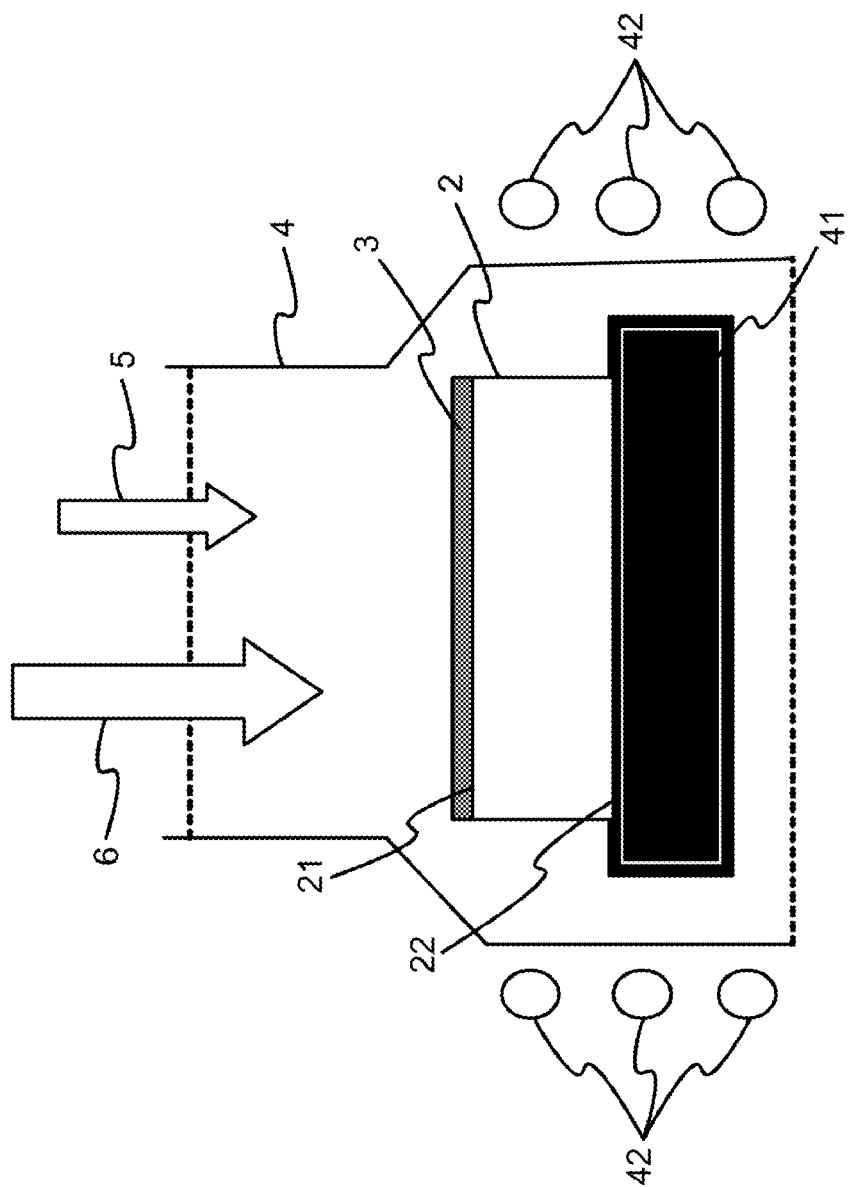
FIG. 4 is the view showing the process of diffusion enhancement.

(c) Processing epitaxy 13: In FIG. 4, a dicholosilane ($Si_2H_2Cl_2$) gas is used as a raw gas 5 for Si epitaxy and hydrogen ($H_2$) is used as a carrying gas for the $Si_2H_2Cl_2$ gas. At a temperature between 1100 and 1300° C., epitaxy is processed for a time period between 1 and 30 min to grow an epitaxial Si thin film 3 having a thickness between 1 and 30 μm on an upper surface 21 of the UMG Si substrate 2 while a lower surface 22 of the UMG Si substrate 2 faces the graphite susceptor 41. Therein, when temperature for epitaxy is raised above 1100° C., some impurities of the UMG Si substrate 2 are driven out from original sink positions; and some other impurities of the UMG Si substrate 2 are dissolved and released out to the epitaxial Si thin film 3 which is used to form sink positions for metal impurities of the UMG Si substrate 2. Step (c) comprises the following individual and comprehensive effects:

(c1) Building concentration gradient: On growing the epitaxial Si thin film 3, the UMG Si substrate 2 has a relatively high metal impurity concentration within the UMG Si substrate 2 with the epitaxial Si thin film 3 having a metal impurity concentration very low or almost zero to build a concentration gradient in between to form a first diffusion drive in the UMG Si substrate 2 for fast diffusing metal impurities of the UMG Si substrate 2 into the epitaxial Si thin film 3. Thus, the metal impurity concentration in the UMG Si substrate 2 is reduced.

(c2) Building temperature gradient: The second surface 22 of the UMG Si substrate 2 directly faces the heated graphite susceptor 41 to have a relatively high temperature while the epitaxial Si thin film 3 grown on the UMG Si substrate 2 directly faces the raw gas 5 ($Si_2H_2Cl_2$) and the carrying gas 6 ($H_2$) to have a relatively low temperature; and, thus, a temperature gradient is formed between the two surfaces 21,22 of the UMG Si substrate 2 to form a second diffusion drive in the UMG Si substrate 2 for rapidly diffusing the metal impurities of the UMG Si substrate 2 into the epitaxial Si thin film 3. Thus, diffusion of the metal impurities in the UMG Si substrate 2 is enhanced to reduce the impurity concentration.

(c3) Building interface defect: Between the UMG Si substrate 2 and the epitaxial Si thin film 3, imperfection is formed by lattice matching to produce sink positions for the metal impurities.

Figure 5:
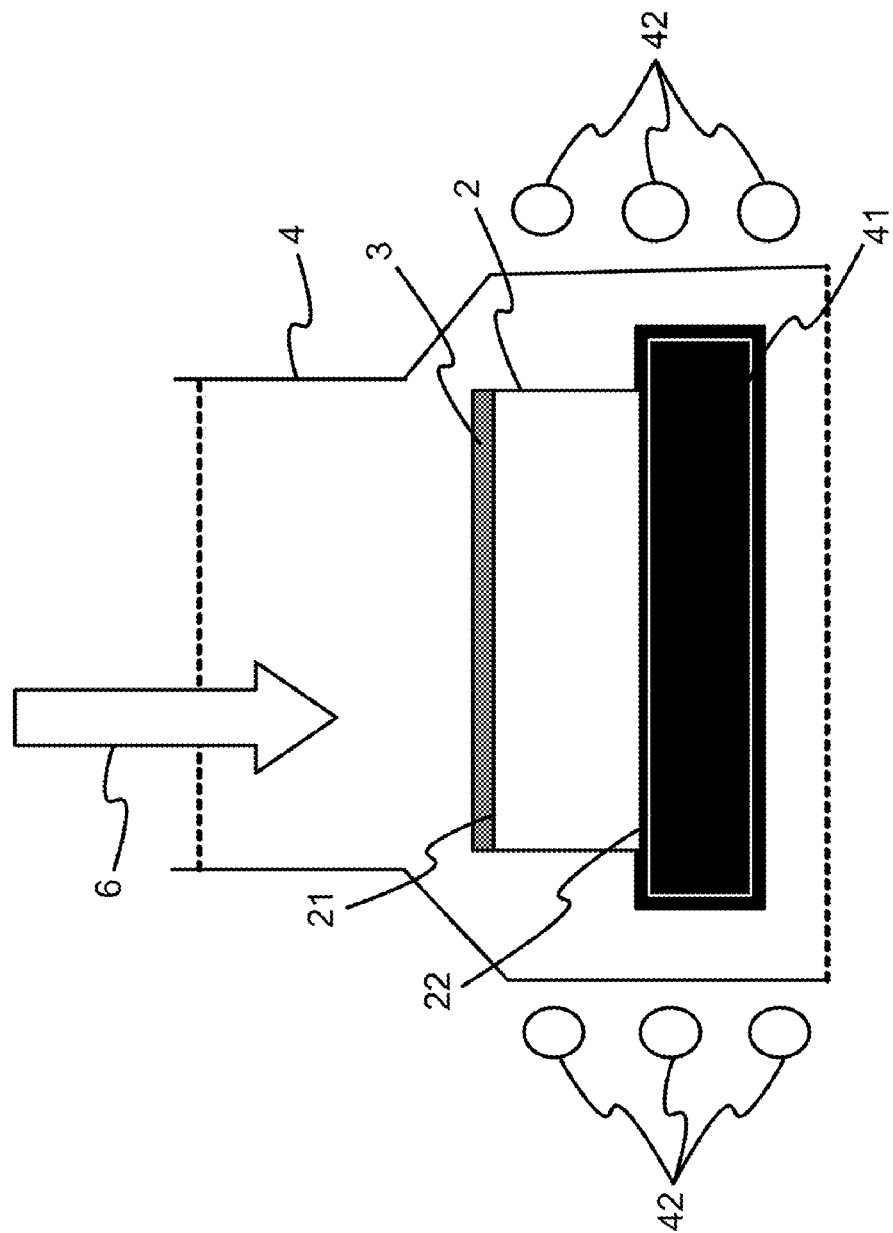
FIG. 5 is the view showing the process of epitaxy.

(d) Enhancing diffusion 14: In FIG. 5, diffusion of the metal impurities is enhanced. The raw gas 5 of $Si_2H_2Cl_2$ stops providing, yet the carrying gas 6 keeps providing for a time period between 10 and 30 min for enhancing diffusion. After the time period for enhancing diffusion, power is switched off for rapidly reducing temperature at a velocity between 10 and 50° C. per minutes (° C./min).

Figure 6:
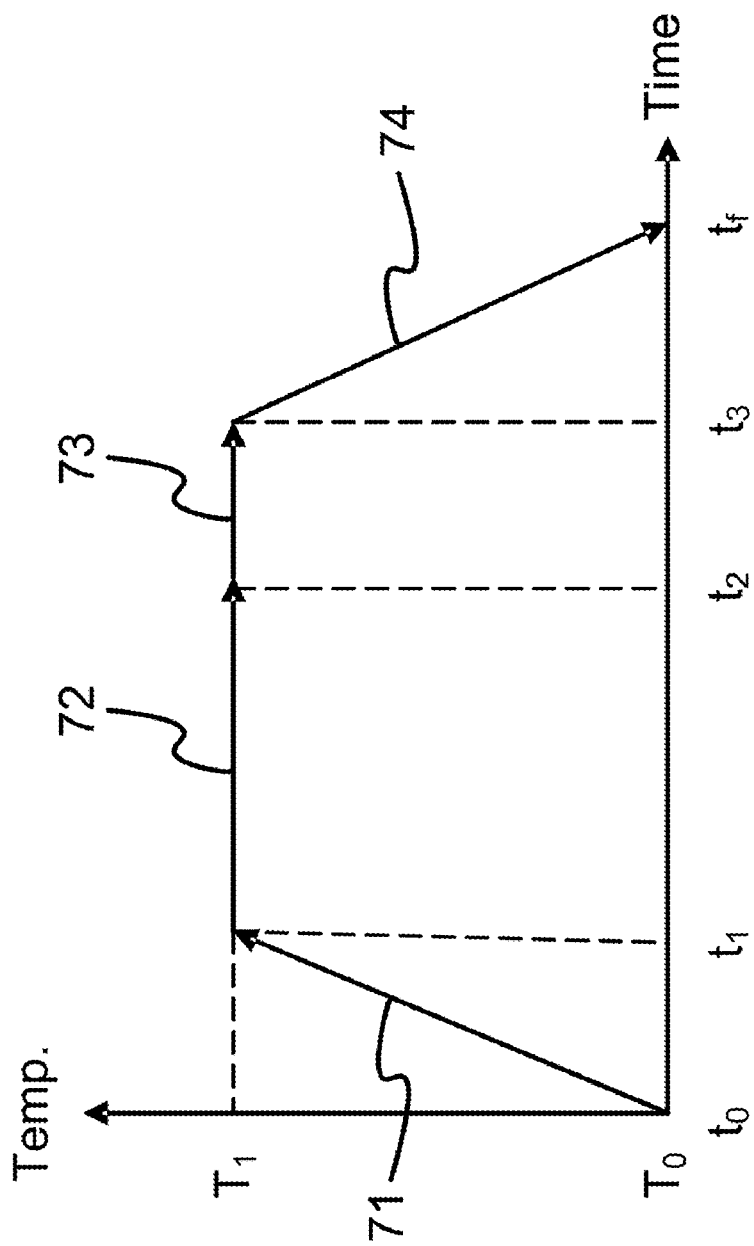
FIG. 6 is the view showing the temperature and time for gettering.

Please refer to FIG. 6, which is a view showing temperature and time for gettering. As shown in the figure, a process of heating is shown in a first process section 81; a process of epitaxy is shown in a second process section 82; a process of diffusion enhancement is shown in a third process section 83; and a process of temperature reduction is shown in a fourth process section 84. Room temperature is shown by $T_0$; and a gettering temperature is shown by $T_1$, which is between 1100 and 1300° C. A starting time for epitaxy is shown by $t_1$; an ending time for epitaxy (i.e. a starting time for diffusion enhancement) is shown by $t_2$; an ending time for diffusion enhancement is shown by $t_3$; and, an ending time for gettering is shown by $t_f$. Therein, a time for heating is $t_0$-$t_1$, which has a heating velocity between 40 and 60° C./min; a time for growing an epitaxial Si thin film is $t_1$-$t_2$, which is a time period between 1 and 30 min; a time for enhancing diffusion of metal impurities is $t_2$-$t_3$, which is a time period between 5 and 15 min; and, a time for gettering is $t_3$-$t_f$, which is a time period between 10 and 50 min.

The present disclosure provides a simple, fast and effective method to reduce a metal impurity concentration in a low-cost physically-made UMG Si wafer to a level of metal impurity ratio of solar-grade Si metal to obtain a physically-made solar-grade Si wafer for being used in and fabricating a low-cost Si-based solar cell. On using the present disclosure, an APCVD equipment is used. A physically-made UMG p-type Si wafer having a 5N purity is selected to grow a high-quality epitaxial Si thin film having a low impurity concentration on its upper surface. Through continuous heat treating diffusion, the epitaxial Si thin film is used to form sink positions for the metal impurities in the UMG Si wafer; and, by building individual and comprehensive effects of a concentration gradient, a temperature gradient and an interface defect, the impurity concentration of the physically-made UMG Si wafer is raised from 5N to 6N.

Hence, the present disclosure has the following characteristics and effects:

1. For gettering, only an APCVD equipment is required with a single continuous epitaxy and diffusion process.

2. A low-cost physically-made UMG Si wafer is selected as a material to be gettered.

3. An epitaxial Si thin film is formed through an epitaxy process by using the APCVD equipment to have sink positions for metal impurities.

4. Because the APCVD equipment can rapidly raise up or cool down a temperature, most of the metal impurities has a higher diffusion coefficient or velocity at a temperature higher than 1100° C. to be diffused into the epitaxial Si thin film in a short time; and, then, the temperature is rapidly cooled down to lock the metal impurity in the epitaxial Si thin film.

5. With a relatively high metal impurity concentration of the physically-made UMG Si wafer and a relatively low, even close to zero, metal impurity concentration of the epitaxial Si thin film, a concentration gradient having a big drop is built for rapid diffusion.

6. The physically-made UMG Si wafer is directly contacted with a heated graphite susceptor to have a relatively high temperature; and, the epitaxial Si thin film directly faces a raw gas and a carrying gas to have a relatively low temperature. Thus, a temperature gradient is built to further enhance the diffusion of the metal impurities.

7. Between the physically-made UMG Si wafer and the epitaxial Si thin film, imperfection is generated by lattice matching to form sink positions for the metal impurities.

With the above simple processes and equipments together with building diffusion mechanisms of concentration and temperature gradients, high-density metal impurities in a physically-made UMG Si wafer are diffused or transferred into an epitaxial Si thin film for reducing a metal impurity concentration of the physically-made UMG Si wafer to obtain a low-cost physically-made solar-grade Si wafer for fabricating a solar cell device.

To sum up, the present disclosure is a method of reducing metal impurities of a UMG Si wafer by using an epitaxial Si film, where an APCVD equipment is used without a vacuum system to obtain a low-cost physically-made solar-grade silicon wafer with an epitaxial Si thin film having sink positions for metal impurities of a UMG Si wafer.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A method of reducing metal impurities of an upgraded metallurgical grade (UMG) silicon (Si) wafer by using an epitaxial silicon film, the method comprising:
   (a) obtaining a UMG Si substrate as a gettering material, wherein said UMG Si substrate has a purity not greater than 99.999% (5N) and a thickness not greater than 200 micrometers (μm);
   (b) placing said UMG Si substrate on a graphite susceptor into a reaction chamber of an atmospheric pressure chemical vapor deposition (APCVD) equipment and raising a temperature of said graphite susceptor in said reaction chamber of said APCVD equipment from a room temperature until at least 1100 Celsius degrees (° C.) by radiofrequency coils circled around said reaction chamber of said APCVD equipment;
   (c) obtaining a gas of dicholosilane ($Si_2H_2Cl_2$) as a raw gas for epitaxial Si and a hydrogen gas as a carrying gas of said $Si_2H_2Cl_2$ gas to obtain an epitaxial Si thin film on a first surface of said UMG Si substrate with a second surface of said UMG Si substrate facing said graphite susceptor,
   wherein, on raising said temperature in said reaction chamber to a temperature above 1100° C., some impurity in said UMG Si substrate is driven away from original sink positions, some impurity in said UMG Si substrate is dissolved, and both are released to new sink positions on said epitaxial Si thin film; wherein step (c) comprises steps of:
      (c1) obtaining a concentration gradient through a relatively high metal impurity concentration in said UMG Si substrate and a very low, even close to zero, metal impurity concentration of said epitaxial Si thin film to obtain a first diffusion drive of impurity in said UMG Si substrate to diffuse metal impurities in said UMG Si substrate into said epitaxial Si thin film to reduce a metal impurity concentration of said UMG Si substrate;
      (c2) obtaining a temperature gradient through a relatively high temperature of said UMG Si substrate and a relatively low temperature of said epitaxial Si thin film to obtain a second diffusion drive of impurity in said UMG Si substrate to diffuse metal impurities of said UMG Si substrate into said epitaxial Si thin film to reduce a metal impurity concentration of said UMG Si substrate,
   wherein said UMG Si substrate obtains said relatively high temperature by directly contacting with said heated-up graphite susceptor; and
   wherein said epitaxial Si thin film obtains said relatively low temperature by directly perpendicularly facing said raw gas and said carrying gas; and
      (c3) obtaining sink positions of metal impurities through imperfection formed by lattice matching of said UMG Si substrate and said epitaxial silicon/Si thin film; and
   (d) stopping providing said raw gas of $Si_2H_2Cl_2$; keeping providing said carrying gas of $H_2$; and switching off power to rapidly reduce temperature after finishing diffusing metal impurities of said UMG Si substrate.

2. The method according to claim 1, wherein said UMG Si substrate is selected from a group consisting of a p-type UMG Si substrate and an n-type UMG Si substrate.

3. The method according to claim 1, wherein, in step (b), said UMG Si substrate is heated for a time period between 20 and 30 minutes (min).

4. The method according to claim 1, wherein, in step (c), said UMG Si substrate is processed through epitaxy at a temperature between 1100 and 1300° C. for a time period between 1 and 30 min.

5. The method according to claim 1, wherein said epitaxial Si thin film has a thickness between 1 and 30 μm.

6. The method according to claim 1, wherein, in step (c), said first surface of said UMG Si substrate faces said raw gas of $Si_2H_2Cl_2$ and said carrying gas of $H_2$ perpendicularly.

7. The method according to claim 1, wherein, in step (d), said metal impurities of said UMG Si substrate is diffused for a time period between 10 and 30 min.

8. The method according to claim 1, wherein, in step (d), temperature is rapidly reduced at a velocity between 10 and 50° C. per minute (° C./min).

* * * * *